(12) United States Patent
Ishii et al.

(10) Patent No.: US 6,706,425 B2
(45) Date of Patent: Mar. 16, 2004

(54) ORGANIC EL PANEL AND FILTER FOR SAME

(75) Inventors: Ikuko Ishii, Tokyo (JP); Yoshikazu Sakaguchi, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 10/400,862

(22) Filed: Mar. 27, 2003

(65) Prior Publication Data

US 2003/0203235 A1 Oct. 30, 2003

Related U.S. Application Data

(63) Continuation of application No. 09/619,826, filed on Jul. 20, 2000, now abandoned.

(30) Foreign Application Priority Data

Jul. 21, 1999 (JP) .............................................. 11-206530

(51) Int. Cl.$^7$ .............................................. H05B 33/00
(52) U.S. Cl. ..................... 428/690; 428/917; 313/504; 313/506; 313/512; 257/98
(58) Field of Search ................. 428/690, 917; 257/98; 313/512, 504, 506

(56) References Cited

U.S. PATENT DOCUMENTS

| 4,577,928 A | * | 3/1986 | Brown ................... 350/276 R |
| 4,989,953 A | * | 2/1991 | Kirschner ................... 350/311 |
| 5,486,840 A | * | 1/1996 | Borrego et al. ................ 345/7 |
| 6,008,871 A | * | 12/1999 | Okumura ..................... 349/61 |
| 6,020,945 A | * | 2/2000 | Sawai et al. ................. 349/119 |

FOREIGN PATENT DOCUMENTS

| JP | 8-321381 | 12/1996 | ........... H05B/33/14 |
| JP | 08-321381 | 12/1996 | ........... H05B/33/14 |
| JP | 9-127885 | 5/1997 | ............. G09F/9/30 |
| JP | 2761453 | 3/1998 | ........... H05B/33/14 |
| JP | 10-255978 | 9/1998 | ........... H05B/33/22 |
| JP | 10-508979 | 9/1998 | ........... H05B/33/14 |
| JP | 11-10774 | 1/1999 | ............. B32B/7/02 |
| JP | 11-45058 | 2/1999 | ............. G09F/9/30 |
| KR | 1990-0006799 | 9/1990 | ........... H05B/33/10 |
| WO | WO 97/12276 | 4/1997 | ......... G02F/1/1335 |
| WO | WO 97/38452 | 10/1997 | ........... H01L/51/20 |
| WO | WO 98/17083 | 4/1998 | ........... H05B/33/12 |
| WO | WO 98/28767 | 7/1998 | ............. H01J/1/63 |

OTHER PUBLICATIONS

Partial citation and English translation from the Japanese Office Action for application's foreign priority document Japanese application 11–206530 filed Jul. 21, 1999.*
"Liquid Crystal Display Technology–Active Matrix LCD", Matsumoto Shoichi, Sangyozusha, K.K., 1996, pp. 230–232.

* cited by examiner

*Primary Examiner*—Cynthia H. Kelly
*Assistant Examiner*—Dawn Garrett
(74) *Attorney, Agent, or Firm*—Hayes Soloway P.C.

(57) ABSTRACT

In a filter for an organic EL panel formed by a quarter-wave layer ($\lambda/4$ plate), a polarizing layer and an anti-glare layer, the polarization of the polarizing layer is between 50% and 70%, and the haze value of the anti-glare layer is between 5% and 15%.

5 Claims, 2 Drawing Sheets

Fig. 1
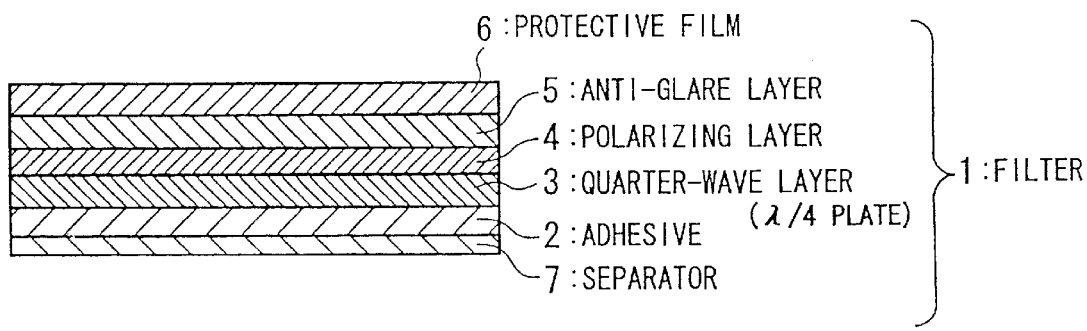
Fig. 2
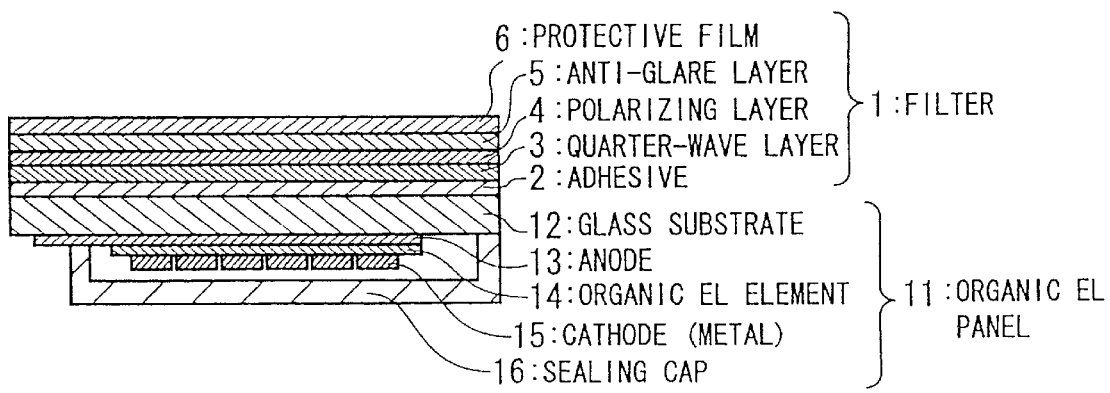
Fig. 3
| | CONTRAST | LUMINANCE WITH VOLTAGE APPLIED (cd/m2) | LUMINANCE WITH NO VOLTAGE APPLIED (cd/m2) | APPLIED VOLTAGE (V) |
|---|---|---|---|---|
| EMBODIMENT | 154 | 100.1 | 0.65 | 12 |
| COMPARATIVE EXAMPLE 1 | 22 | 154.1 | 6.87 | 12 |
| COMPARATIVE EXAMPLE 2 | 70 | 44.9 | 0.64 | 12 |

ORGANIC EL PANEL AND FILTER FOR SAME

CROSS REFERENCE TO RELATED APPLICATION

This application is a continuation of U.S. application Ser. No. 09/619,826, filed Jul. 20, 2000, now abandoned.

BACKGROUND OF THE INVENTION

1. Field of the Invention

The present invention relates to an organic EL panel and a filter thereof, and more particularly to an organic EL panel and filter thereof which enable the achievement of a clear, sharp image.

2. Related Art

An organic EL element is formed by an organic solid-state luminescent layer made of a phosphor such as anthracene and a positive hole-injection layer made of a triphenylamine dielectric, or a luminescent layer and an electron-injection layer made of a perylene, or a positive hole-injection layer, a luminescent layer and an electron-injection layer sandwiched between two electrodes, which is generally formed on a substrate.

In an organic EL element such as noted above, light is emitted when electrons that are injected from a cathode into the luminescent layer recombine with positive holes that are injected from an anode into the luminescent layer. For this reason, an organic EL element can be driven with a low voltage such as 4 V by making the luminescent layer thin, and also has the advantage of fast response. Because it emits light itself, it also has an advantage of a wide viewing angle.

However, the above-mentioned two electrodes made of the metal thin films have a high reflectivity with respect to visible light, and regardless of whether or not the organic EL element is emitting light, reflected light of external light striking them exits from the light-extraction surface. For this reason, the contrast of an organic EL panel in the past was relatively low.

Given the above, a filter for transmission-type LCDs is disposed on the outside of the light-extraction surface.

FIG. 4 shows a filter of the past. This filter (for example, the Nitto Denko type NPF-F1228DU) is formed by a polarizing layer 4 having a polarization of approximately 95% and a quarter-wave layer ($\lambda/4$ plate) 23. However, an organic EL display is characterized in self-emission of light, so that it does not require as much polarization as an LCD.

In the Japanese Patent No. 2,761,453, there is indicated technology in which, for fabricating an organic EL element in which the transmittance of an electrode positioned on the light-extracting surface is 10% or greater over the wavelength region from 400 to 600 nm, and the reflectivity of the electrode positioned on the opposite side from the light-extracting surface is 50% or greater over the wavelength region from 400 to 600 nm, a polarizing film is combined with a retardation layer or film ($\lambda/4$ plate) and disposed on the light-extracting surface. Although the cited invention causes some improvement in the contrast, it does not yet achieve a satisfactory level.

The Japanese Unexamined Patent Publication (KOKAI) No. 10-508979 (International Publication Number WO 97/07654 Al) discloses an EL panel, however this EL panel is different from the present invention in terms of problem to be solved and constitution.

Accordingly, an object of the present invention is to improve on the above-noted problem with the prior art, and to obtain an organic EL panel having a clear and sharp image, by specifying the polarization and haze value of the filter.

SUMMARY OF THE INVENTION

In order to achieve the above-noted object, the present invention has the following basic technical constitution.

Specifically, a first aspect of the present invention is a filter for an organic EL panel formed by a $\lambda/4$ plate, a polarizing layer and an anti-glare layer, wherein the polarization of the polarizing layer is between 50% and 70%.

In a second aspect of the present invention, the haze value of the anti-glare layer is between 5% and 15%.

In a third aspect of the present invention, the $\lambda/4$ plate layer is laminated onto a glass substrate of the organic EL panel, and onto the $\lambda/4$ plate layer is laminated on the polarizing layer.

In a fourth aspect of the present invention, the polarizing layer is laminated onto the glass substrate of the organic EL glass, and onto the polarizing layer is laminated the $\lambda/4$ plate layer.

BRIEF DESCRIPTION OF THE DRAWINGS

FIG. 1 is a cross-sectional view of a filter of an organic EL panel according to the present invention.

FIG. 2 is a cross-sectional view of an organic EL panel with a filter assembled thereto according to the present invention.

FIG. 3 is a table showing the results of measuring the effect of the present invention.

DETAILED DESCRIPTION OF THE PREFERRED EMBODIMENTS

Figure 4:
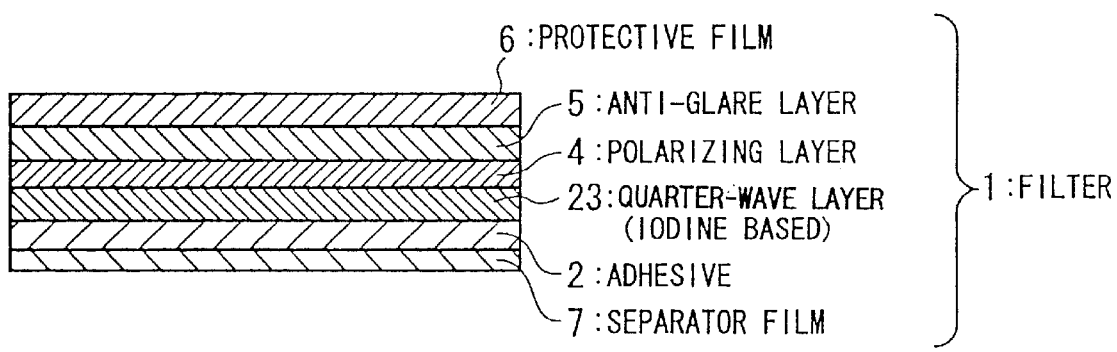
FIG. 4 is a cross-sectional view of a filter according to an example of prior art.

Embodiments of an organic EL panel and filter therefore according to the present invention are described in detail below, with references being made to relevant accompanying drawings.

FIG. 1 through FIG. 3 show an organic EL panel according to the present invention, in which is shown a filter for an organic EL panel formed by a quarter-wave layer, a polarizing layer and an anti-glare layer, wherein the polarization of the polarizing layer is between 50% and 70%, and the haze value of the anti-glare layer is between 5% and 15%.

This embodiment is described in further detail below.

The construction of an organic EL panel according to the present invention is described herein with reference to the cross-sectional view of FIG. 1. In this drawing, various parts are shown with dimensions that make them more visible, which are different from the dimensions of the actual thin films.

The filter according to the present invention is formed by a separator film 7, an adhesive 2, a $\lambda/4$ plate (dye-based) 3, a polarizing layer 4 with a polarization of 60%, an anti-glare layer (AG) with a haze value of 10%, and a protective film 6, and the separator film 7. The adhesive 2, the quarter-wave layer 3, the polarizing layer 4, the anti-glare layer (AG) 5, and a protective film 6 are laminated. The dye-based $\lambda/4$ plate 3 has better durability than an iodine-based layer.

The organic EL panel 11 to which the filter 1 according to the present invention is to be adhered was fabricated by a method described below.

First, on a 1.1-mm-thick non-alkaline glass substrate 12, an ITO film was sputtered to a thickness of 100 nm as an anode 13, thereby forming a transparent substrate. Next, the transparent substrate was held onto a substrate holder in a vacuum deposition chamber, with the ITO film facing downward, and N,N'-diphenyl-N,N'-bis(α-naphthyl)-1, 1'-biphenyl-4,4' diamine (hereinafter abbreviated α-NPD) as a positive hole injection material and positive hole carrier material was put in a resistive heating boat, and tris (8-quinolinolate) aluminum complex (hereinafter abbreviated $Alq_3$) as a luminescent material was put in another resistive heating boat, a vacuum pump being used to exhaust this vacuum deposition chamber to approximately 1×10E−4 Pa or lower. After this was done, a shadow mask with a cutout for forming the positive hole carrier layer and the EL luminescent layer was fixed on the anode side of the transparent substrate, after which current is driven through the resistive heating boat filled with α-NPD, and α-NPD is heated. An α-NPD layer was deposited to a film thickness of 50 nm, and a positive hole carrier layer was formed, after which current is driven through the resistive heating boat filled with $Alq_3$ so as to apply heat and to form a green luminescent layer with a film thickness of 50 nm. This green luminescent layer is an organic EL element 14.

After the above, for example, magnesium and silver were deposited to a film thickness of 200 nm, so as to form a cathode 15. The size of the luminescent layer viewed as a plane is 0.3×0.3 mm for one pixel, these pixels being arranged in a 16×16 matrix. To protect this organic EL panel from moisture in the air, the organic EL panel is sealed within a glass cap 16 filling with nitrogen.

By scanning the cathode 15 of an organic EL panel 11 fabricated as described above by applying a pulse voltage, and by applying a pulse voltage to a selected anode 13 in synchronization with scanning the cathode 15, it is possible to obtain a desired display pattern. In FIG. 2, cathode 15 is perpendicular to the anode 13.

Because the organic thin film fabricated as described above is not only thin, but has transparency to light, external light is reflected on the mirror-surface metal cathode film. For preventing reflections and improving contrast, a filter 1 is disposed on the light-extracting surface of the organic EL panel 11 which is sealed with a glass cap. This filter 1 is configured as shown in FIG. 1. The filter 1 has a polarization of 62%, a haze value of 11.8%, a transmittance of 59.0%, and a neutral gray color. The anti-glare processing is done by hard coating. After removing the separator film 7, an adhesive surface is affixed to the light-extraction surface of the organic EL panel 11.

Comparative example 1 is one in which a filter is affixed to the organic EL panel, and comparison example 2 is one in which a transparent LCD filter (Nitto Denko type NPF-F1228DU, with a transmittance of 48.2% and a polarization of 84.7%) is fixed.

The contrast and luminance of organic EL panels fabricated as described above were measured. For this measurement, the contrast was defined as the luminance with a voltage applied (luminescent condition) with respect to the luminance with no voltage applied (non-luminescent condition), under an illumination of 300 luxes.

FIG. 3 shows the results of measuring the contrast and luminance of the above-noted embodiment and the comparative examples. From this table, it can be seen that the present invention provides an organic EL panel with high visibility, which achieves both a sharp image and prevention of glare.

When the polarization of the polarizing layer exceeds 70%, the luminance passing through the filter 4 is decreased in comparison with the luminance without a filter. That is, if the desired intensity is to be obtained through a filter, it is necessary to further increase the luminance of an EL panel, the result being an increase in the current consumption. On the other hand, if the polarization is below 50%, the circular polarization function of λ/4 plate is lost, resulting in reflection and glare of external light. Therefore, the polarization range is ideally between 50% and 70%.

If the haze value of the anti-glare layer exceeds 15%, of the light from the panel, the proportion of scattered light becomes large, thereby sacrificing screen sharpness, and if the haze value is below 5%, it was found that the anti-glare layer fails to function. Therefore, the haze value range is ideally between 5% and 15%.

In the foregoing description, λ/4 plate is laminated onto a glass substrate of an organic EL panel, and a polarizing layer is laminated over the λ/4 plate, it is alternately possible to achieve the object of the present invention by laminating a polarizing layer onto the glass substrate of an organic EL panel, and then laminating the λ/4 plate over the polarizing layer.

By adopting the configurations described in detail above, an organic EL panel and associated filter according to the present invention provide a highly visible organic EL panel that achieves both prevention of glare and a sharp image.

What is claimed is:

1. An organic electroluminescent (EL) panel comprising;

an organic electroluminescent element;

a quarter-wave plate disposed adjacent said organic electroluminescent element;

a polarizing layer providing substantially between 50% and 70% polarization disposed adjacent said quarter-wave plate; and an anti-glare layer disposed adjacent said polarizing layer.

2. An organic electroluminescent (EL) panel as claim ed in claim 1, wherein said anti-glare layer has a haze value between 5% and 15%, according to the JIS K7105 standard.

3. An organic electroluminescent (EL) panel as claim ed in claim 1, further comprising a glass substrate disposed between said organic electroluminescent element and said quarter-wave plate; wherein said quarter-wave plate is laminated onto said glass substrate.

4. An organic electroluminescent (EL) panel as claim ed in claim 1, wherein said polarizing layer is laminated onto said quarter-wave plate.

5. An organic electroluminescent (EL) panel comprising;

an organic electroluminescent element;

a glass substrate disposed adjacent said organic electroluminescent element;

a polarizing layer providing substantially between 50% and 70% polarization, wherein said polarizing layer is laminated onto said glass substrate; and a quarter-wave plate laminated onto said polarizing layer.

* * * * *